United States Patent
Abe et al.

(10) Patent No.: US 6,303,422 B1
(45) Date of Patent: Oct. 16, 2001

(54) SEMICONDUCTOR MEMORY AND MANUFACTURING METHOD THEREOF

(75) Inventors: Tomohisa Abe; Masaru Ushiroda; Toshio Komuro, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/329,647

(22) Filed: Jun. 9, 1999

(30) Foreign Application Priority Data

Jun. 15, 1998 (JP) .................................................. 10-167214

(51) Int. Cl.⁷ ................................................ H01L 21/8234
(52) U.S. Cl. ........................ 438/238; 438/241; 438/279; 438/586
(58) Field of Search ..................................... 438/238, 241, 438/257, 258, 153, 279, 275, 199, 200, 586

(56) References Cited

U.S. PATENT DOCUMENTS

| | | | |
|---|---|---|---|
| 5,005,068 | * 4/1991 | Ikeda et al. .......................... | 257/392 |
| 5,034,797 | * 7/1991 | Yamanaka et al. ..................... | 357/42 |
| 5,460,995 | * 10/1995 | Kiyono et al. ......................... | 437/52 |
| 5,592,013 | * 1/1997 | Honda .................................. | 257/392 |
| 6,124,617 | * 9/2000 | Yoshihara et al. ..................... | 257/370 |

FOREIGN PATENT DOCUMENTS

| | | |
|---|---|---|
| 60-170966 | 9/1985 | (JP) . |
| 4-17366 | 1/1992 | (JP) . |
| 5-326516 | 12/1993 | (JP) . |
| 7240477 | 9/1995 | (JP) . |
| 8-55852 | 2/1996 | (JP) . |
| 8-130257 | 5/1996 | (JP) . |
| 8241929 | 9/1996 | (JP) . |
| 8274190 | 10/1996 | (JP) . |
| 8-293559 | 11/1996 | (JP) . |
| 9-139435 | 5/1997 | (JP) . |
| 9-213913 | 8/1997 | (JP) . |
| 10-242299 | 9/1998 | (JP) . |

* cited by examiner

Primary Examiner—Michael Trinh
(74) Attorney, Agent, or Firm—Hayes, Soloway, Hennessey, Grossman & Hage, P.C.

(57) ABSTRACT

A semiconductor memory in which a layout margin at the contact hole between wiring layers of a SRAM does not need and the wiring capacity at bit lines is reduced and the high speed processing is made to be possible is provided. The SRAM is constituted of a pair of driving transistors Qd1 and Qd2, a pair of transferring transistors Qt1 and Qt2, high resistance loads R1 and R2, a pair of bit lines BL1 and BL2, and a VCC line and a GND line. Gate electrodes of each transistor and word lines are formed at a first layer, the high resistance loads are formed at a second layer, the VCC line and the GND line are formed at a third layer, and the bit lines are formed at a fourth layer. A shared contact hole using for connecting the high resistance loads to the source/drain area of transistors does not penetrate the other conductive layers. Therefore, the layout margin between the shared contact hole and the other conductive layers becomes unnecessary and the reduction of the cell size becomes possible.

2 Claims, 12 Drawing Sheets

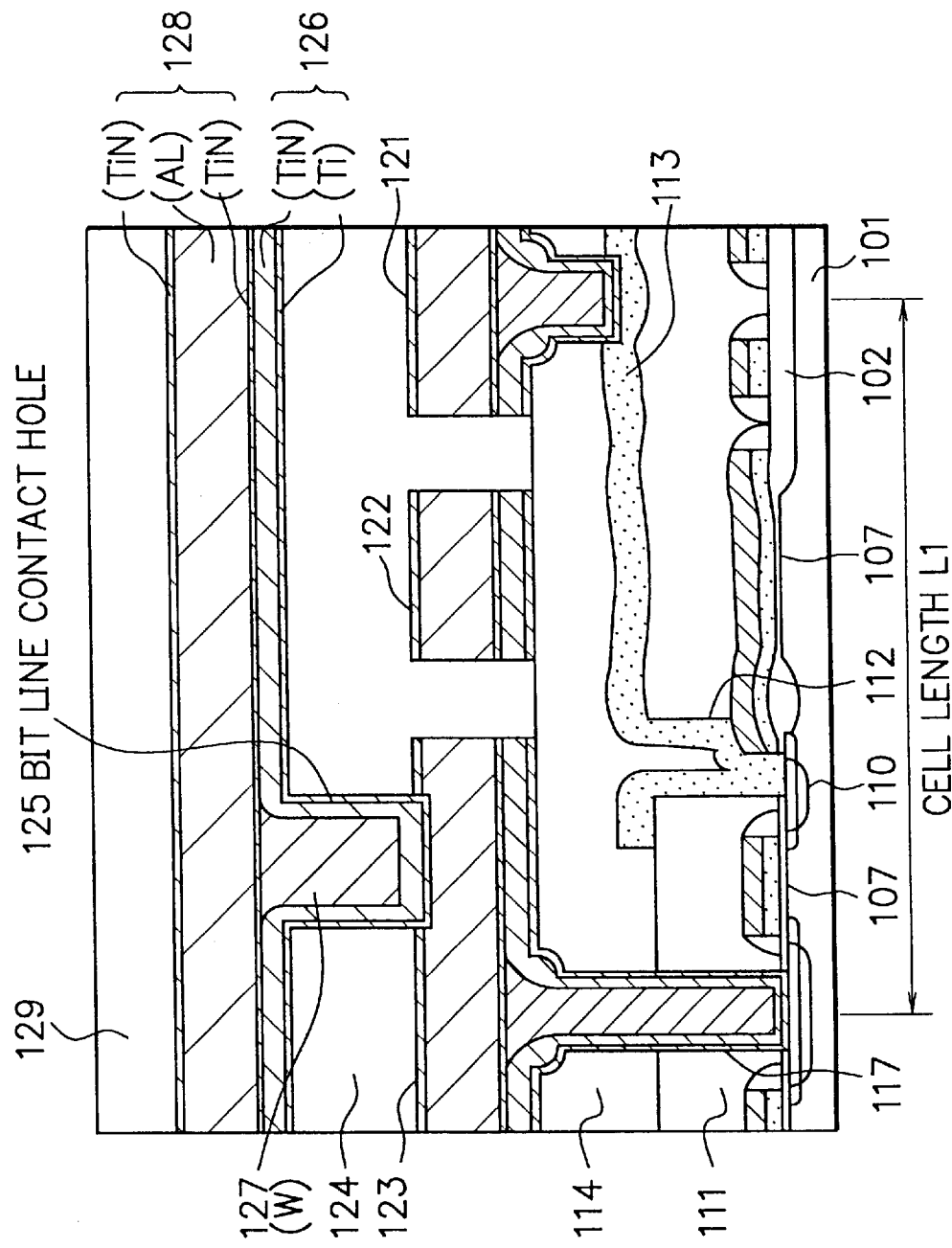

SEMICONDUCTOR MEMORY AND MANUFACTURING METHOD THEREOF

BACKGROUND OF THE INVENTION

The present invention relates to a SRAM (static random access memory) in which in particular its cell size is made to be small and its high speed processing is made to be possible.

Description of the Related Art

FIG. 1 is a circuit diagram showing an equivalent circuit of a high resistance load type SRAM. In this high resistance load type SRAM, loads R1 and R2 are made of a resistive film such as polysilicon, therefore the number of transistors is small enough compared with a SRAM in which loads are composed of transistors. Moreover, this resistive film can be formed in multi-layer, therefore the area of memory cell can be reduced and this SRAM has an advantage to be high density. This type of SRAM is constituted of two driving MOS transistors (hereinafter referred to as driving transistor) Qd1 and Qd2, and two transferring MOS transistors (hereinafter referred to as transferring transistor) Qt1 and Qt2. These transistors are connected to the high resistance loads R1 and R2, and a VCC line being a first power supply and a GND line being a second power supply, and word lines WL1 and WL2, and bit lines BL1 and BL2. The processing of writing and reading information at a SRAM is well known widely, therefore this explanation is omitted.

FIG. 2 is a sectional view showing an example of the conventional SRAM. FIGS. 3A, 3B, 3C and 3D are plane views showing each layer of a cell of the conventional SRAM. Referring to FIGS. 2, 3A, 3B, 3C and 3D, the structure of the SRAM is explained. An element separating oxide film 202 is formed in a required pattern on a semiconductor substrate 201. A gate oxide film 203 is formed on the active area partitioned by this element separating oxide film 202. On this gate oxide film 203, a gate electrode 204 is formed using polysilicon made to be low resistance and polycide made of silicide. A part of this gate electrode 204 works as word lines WL1 and WL2. A N type impurity is implanted to the active area which is partitioned by the element separating oxide film 202 and is masked by the gate electrode 204, and a source/drain area 205 of the MOS transistor is formed. With mentioned above process, the first and second driving transistors Qd1 and Qd2, and the first and second transferring transistors Qt1 and Qt2 are formed with the gate electrode 204 and the source/drain area 205 (FIG. 3A).

Next, a first dielectric interlayer 206 is formed on the whole surface. As shown in FIG. 3B, after a contact hole 207 is opened at each source area of the driving transistor Qd1 and Qd2, a silicide layer is formed on the whole surface and this silicide layer is formed into a required pattern and a GND line 208 is formed. After a second dielectric interlayer 209 is formed on this, a contact hole 210 between the first dielectric interlayer 206 and the second dielectric interlayer 209 is opened. A high resistance polysilicon film is formed at the area including this contact hole 210 and is formed into a required pattern and high resistance loads 211 (R1 and R2) are formed. The contact hole 210 is formed as a shared contact hole. At a part of the polysilicon film which composes the high resistance load 211, as shown in FIG. 3C, a VCC line 212 is formed by implanting impurity selectively and lowering the resistance. A third dielectric interlayer 213 is formed on the whole surface. And a bit line contact hole 214 is opened, by penetrating from the first dielectric interlayer 206, the second dielectric interlayer 209 and the third dielectric interlayer 213, and reaches the source areas of the transferring transistors Qt1 and Qt2. An aluminum film is formed on the whole surface and is formed into a required pattern, as shown in FIG. 3D, bit lines 215 (BL1 and BL2) which make the bit line contact hole 214 bit line contact are formed. And a passivate dielectric interlayer 216 is formed on the whole surface and the SRAM is completed.

However, in this kind of SRAM, in order to increase the density of memory cells, the reduction of the area of the memory cell has been tried. As one of the methods to achieve this, the designing of the respective patterns of transistors, high resistance loads, and a first and a second power supply lines and the layout has been suitably implemented. The SRAM shown in FIG. 2 is one of the solutions. However, in this conventional SRAM, each conductive layer laminated on the semiconductor substrate is composed of the gate electrode 204, the VCC line 212 or the GND line 208, the high resistance load 211, and the bit line 215 from the bottom in sequence. Therefore, the shared contact hole 210, to which the drain area and gate electrode of the driving transistor, the source area of the transferring transistor and the high resistance load are connected together, is formed penetrating the first dielectric interlayer 206, the GND line 208 and the second dielectric interlayer 209.

As mentioned above, the shared contact hole 210 must be formed penetrating the GND line 208, therefore the depth of the shared contact hole 210 is liable to be deep. Therefore, at the case that the area of the shared contact hole 210 is made to be fine structure, the aspect ratio becomes large, the filling high resistance load material into the shared contact hole 210 becomes difficult and it becomes a factor to increase the shared contact resistance. Considering the mask position shift by the photo lithography technology at forming the shared contact hole 210 and the pattern position shift of the GND line 208 existing at the area where the shared contact hole 210 is penetrated, a required layout margin MG1 must be secured in order not to be shorted the shared contact hole 210 to the GND line 208. Therefore, because of that the area for the layout margin MG1 must be secured between the shared contact hole 210 and the GND line 208, this layout margin area becomes an obstacle at reducing the area of the memory cell.

Moreover, the bit line contact hole 214 is needed in order to connect the bit line 215 to the drain area of the transferring transistor formed on the semiconductor substrate. This bit line contact hole 214 is formed penetrating the high resistance load 211, the VCC line 212, the GND line 208 and the gate electrode 204. The layout margin of each layer for this bit line contact hole 214 must be also secured. Especially, the VCC line 212 is the polysilicon made to be low resistance and is difficult to be made low resistance compared with the metal material. Therefore, the area of the VCC line 212 is made to be as large as possible in the designing, and securing a layout margin MG2 between the bit line contact hole 214 and the VCC line 212 is needed. Consequently, it is difficult to reduce the cell length L2 shown in FIG. 2. At the bit line contact hole 214, as the same as the shared contact hole 210, the problem that the aspect ratio becomes large and the contact resistance increases occurs.

Furthermore, at the memory cell shown in FIG. 2, the GND line 208 is extended right under the bit line 215 being the uppermost layer, and the second dielectric interlayer 209 and the third dielectric interlayer 213 are positioned between the bit line 215 and the GND line 208. By this, the wiring capacity of the bit line 215 becomes large, it becomes an obstacle to realize the high speed writing and reading for the memory cell.

As this kind of SRAM, several Japanese patent applications are disclosed. For example, the Japanese Patent Application Laid-Open No. HEI 7-240477 discloses a SRAM using a high resistance load made of polysilicon. At this SRAM, a gate electrode is formed by a first layer polysilicon film, a word line is formed by a second layer polysilicon film, a high resistance load and a first power supply line are formed by a third layer polysilicon film, and a second power supply line and a bit line are formed by a first layer aluminum film. At this structure, a shared contact hole connecting the gate electrode and the high resistance load must be formed penetrating the second layer polysilicon film being the word line. Therefore, the aspect ratio becomes large and a margin for the second layer polysilicon film must be secured, and the occurrence of the mentioned above problems is not avoided.

The Japanese Patent Application Laid-Open No. HEI 8-274190 discloses a SRAM. At this SRAM, a gate electrode is formed by a first layer polysilicon film, a first and a second power supply lines are formed by a tungsten film, a high resistance load is formed by a SIPOS (semi insulated polysilicon), and a bit line is formed by an aluminum film. This SRAM have also the same problem as the Japanese Patent application Laid-Open No. HEI 7-240477. And the Japanese Patent Application Laid-Open No. HEI 8-241929 discloses the same kind of SRAM.

SUMMARY OF THE INVENTION

It is therefore an object of the present invention to provide a semiconductor memory and a manufacturing method thereof which reduce or do not need a layout margin at a contact hole and make the size of memory cells small and decrease the wiring capacity at a bit line and make the high speed processing possible.

According to a first aspect of the present invention, for achieving the above mentioned objects, at a semiconductor memory whose static type memory cell is constituted of a pair of driving transistors, a pair of transferring transistors, a pair of high resistance loads, a pair of bit lines, a first power supply line and a second power supply line, and each gate electrode of said driving transistors and said transferring transistors, and word lines are formed by a first layer conductive film, said high resistance loads are formed by a second layer resistive film, and said first power supply line and said second power supply line are formed by a third layer conductive film, and said bit lines are formed by a fourth layer conductive film.

According to a second aspect of the present invention, in the first aspect, gate electrodes and drain areas of said pair of driving transistors are connected in cross, and drain areas of said driving transistors are made to be common to source areas of said pair of transferring transistors, said high resistance loads are electrically connected to said common source/drain areas and the gate electrodes by a contact hole penetrated a first dielectric interlayer positioned between said first layer conductive film and said second layer resistive film.

According to a third aspect of the present invention, in the first aspect, said third layer conductive film is separately formed into a required pattern, and said first power supply line and said second power supply line are formed by one part of this separately formed pattern, and an interconnect line is formed by the other part of this separately formed pattern, and said bit lines and the drain areas of said transferring transistors are electrically connected by a bit line contact hole via said interconnect line.

According to a fourth aspect of the present invention, in the third aspect, said first power supply line and said second power supply line are extended in parallel.

According to a fifth aspect of the present invention, in the first aspect, said first layer conductive film is a polysilicon film made the resistance low, and said second layer resistive film is a high resistive polysilicon film, and said third layer conductive film and said fourth layer conductive film are metal films.

According to a sixth aspect of the present invention, in the first aspect, said first layer conductive film is a polycide film laminated the polysilicon film made the resistance low and the metal silicide film, and said second layer resistive film is a high resistive polysilicon film, and said third layer conductive film and said fourth layer conductive film are metal films.

According to a seventh aspect of the present invention, a manufacturing method of semiconductor memory provides a process which makes active areas of driving transistors and transferring transistors, isolated by insulation film on a semiconductor substrate by etching, a process which forms word lines and gate electrodes of said driving transistors and gate electrodes of said transferring transistors with a conductive film on a gate oxide film in said transistor active areas, a process forming a first dielectric interlayer on the whole surface, a process which opens a first contact hole exposing the common source/drain area for said driving transistors and said transferring transistors and exposing the gate electrode of the other driving transistor being a pair of said driving transistors on said first dielectric interlayer, a process which forms a high resistance load, which is electrically connected to said common source/drain area and said gate electrode via said first contact hole, by forming polysilicon into a required pattern, a process forming a second dielectric interlayer on the whole surface, a process which opens a second contact hole exposing said high resistance load at said second dielectric interlayer and opens third and fourth contact holes exposing the source area of said driving transistors and the drain area of said transferring transistors at said second dielectric interlayer and said first dielectric interlayer, a process which forms a first power supply line connecting electrically to said high resistance load, and forms a second power supply line connecting electrically to the source area of said driving transistor, and forms an interconnect line connecting electrically to the drain area of said transferring transistor, by forming said first metal film into a required pattern, a process forming a third dielectric interlayer on the whole surface, a process which opens a fifth contact hole exposing said interconnect line at said third dielectric interlayer, and a process which forms bit lines connecting electrically to said interconnect line by formed said second metal film into a required pattern.

According to an eighth aspect of the present invention, in the seventh aspect, said conductive film for forming said gate electrodes and said word lines is formed by a polysilicon film or a polycide film.

At a semiconductor memory of the present invention, that is, at a high resistance load type SRAM composed of a pair of driving transistors and a pair of transferring transistors, the high resistance load is formed at the second layer which is positioned right above the first layer formed the gate electrode of each transistor. Therefore, the shared contact hole connecting each transistor to the high resistance load does not need to penetrate the layers of the first and second power supply lines and the layout margin between the shared contact hole and each power supply line does not need. Consequently, the area of the memory cell can be reduced.

Moreover, the first and second power supply lines are formed at the same layer of the third layer and the interconnect line is composed of a part of this third layer, and the bit line is electrically connected to the drain area of each transistor via this interconnect line. Therefore, the layout margin between the bit line contact hole and the power supply lines does not need and the area of the memory cell can be further reduced.

Furthermore, the first and second power supply lines are positioned at the upper layer of the high resistance load, therefore the first and second power supply lines can be formed by metal, especially aluminum. Consequently, the power supply line can be made to low resistance and the area of the power supply line can be reduced. And the facing area to the bit line is reduced and the capacity of the bit line is reduced and then the high speed processing of memorizing information can be realized.

BRIEF DESCRIPTION OF THE DRAWINGS

The objects and features of the present invention will become more apparent from the consideration of the following detailed description taken in conjunction with the accompanying drawings in which:

FIG. 12 is a sectional view showing the fifth process.

DESCRIPTION OF THE PREFERRED EMBODIMENTS

Figure 1:
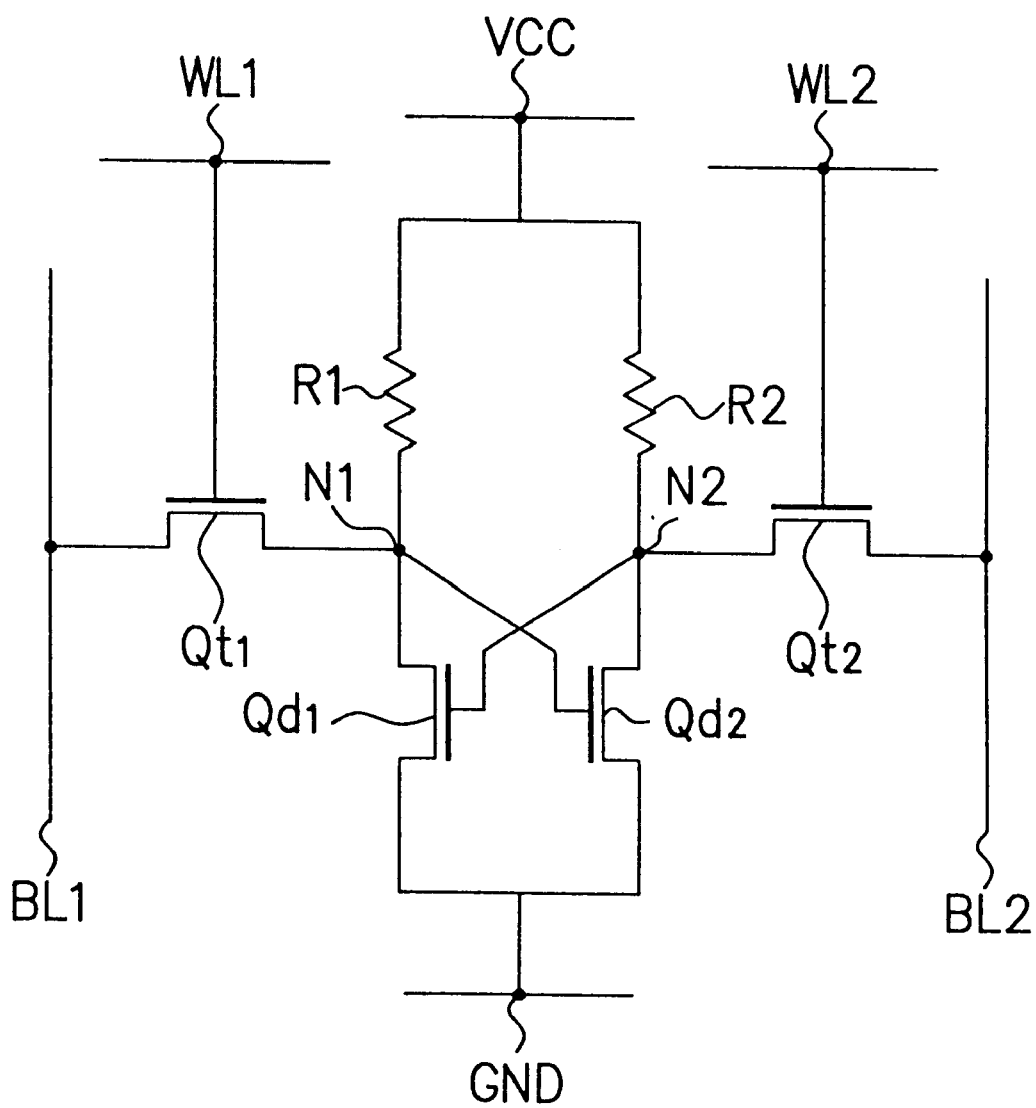
FIG. 1 is a circuit diagram showing an equivalent circuit of a high resistance load type SRAM.

Referring now to the drawings, an embodiment of the present invention is explained in detail. Referring to FIGS. 4 to 12, the present invention is explained. FIGS. 4 to 12 are layout diagrams or sectional views showing an embodiment of manufacturing processes to manufacture an equivalent circuit of a SRAM shown in FIG. 1 in sequence. In the layout diagrams, four cells are shown and the layers to be explained are shown in dotted pattern. The sectional views show the part of AA line in FIG. 4.

Figure 4:
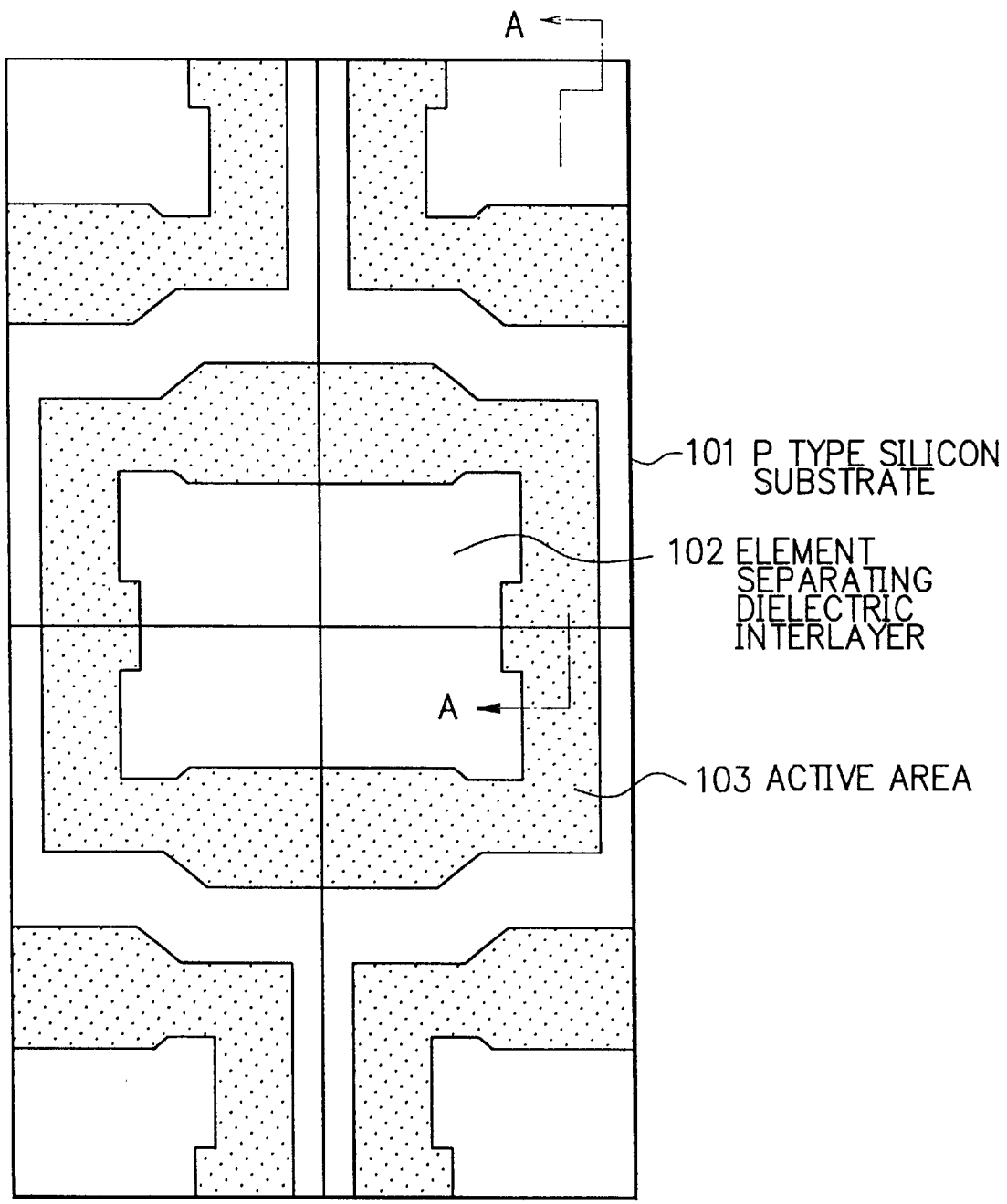
FIG. 4 is a layout diagram showing a first process to manufacture a SRAM of the present invention.

FIG. 4 is a layout diagram showing a first process to manufacture a SRAM of the present invention. First, in FIG. 4, an element separating dielectric interlayer 102 is formed by a silicon oxide film oxidized selectively the surface of a P type silicon substrate 101. And an active area 103 for transferring transistors Qt1 and Qt2, and for driving transistors Qd1 and Qd2 is formed by etching.

Figure 5:
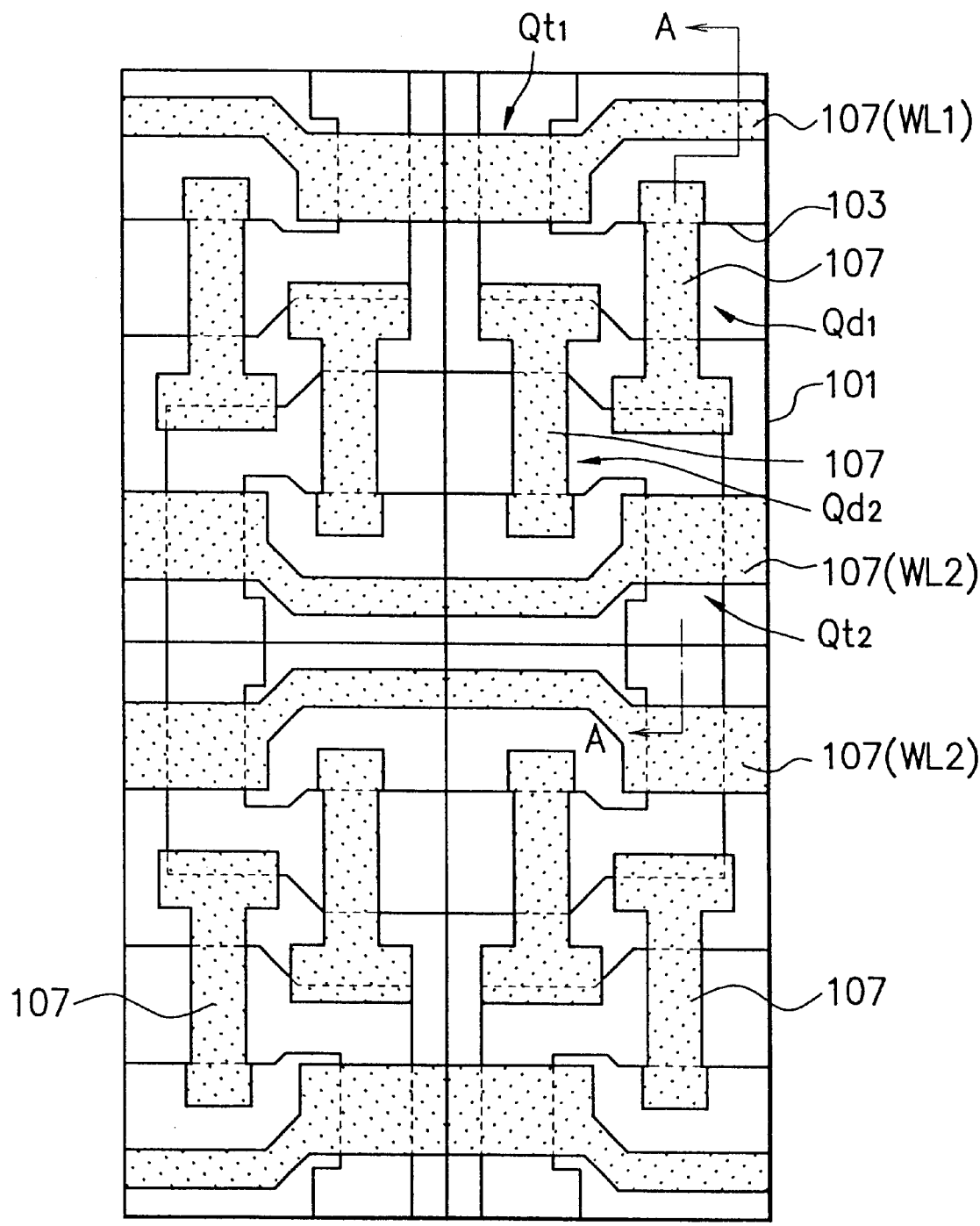
FIG. 5 is a layout diagram showing a second process to manufacture a SRAM of the present invention.
Figure 6:
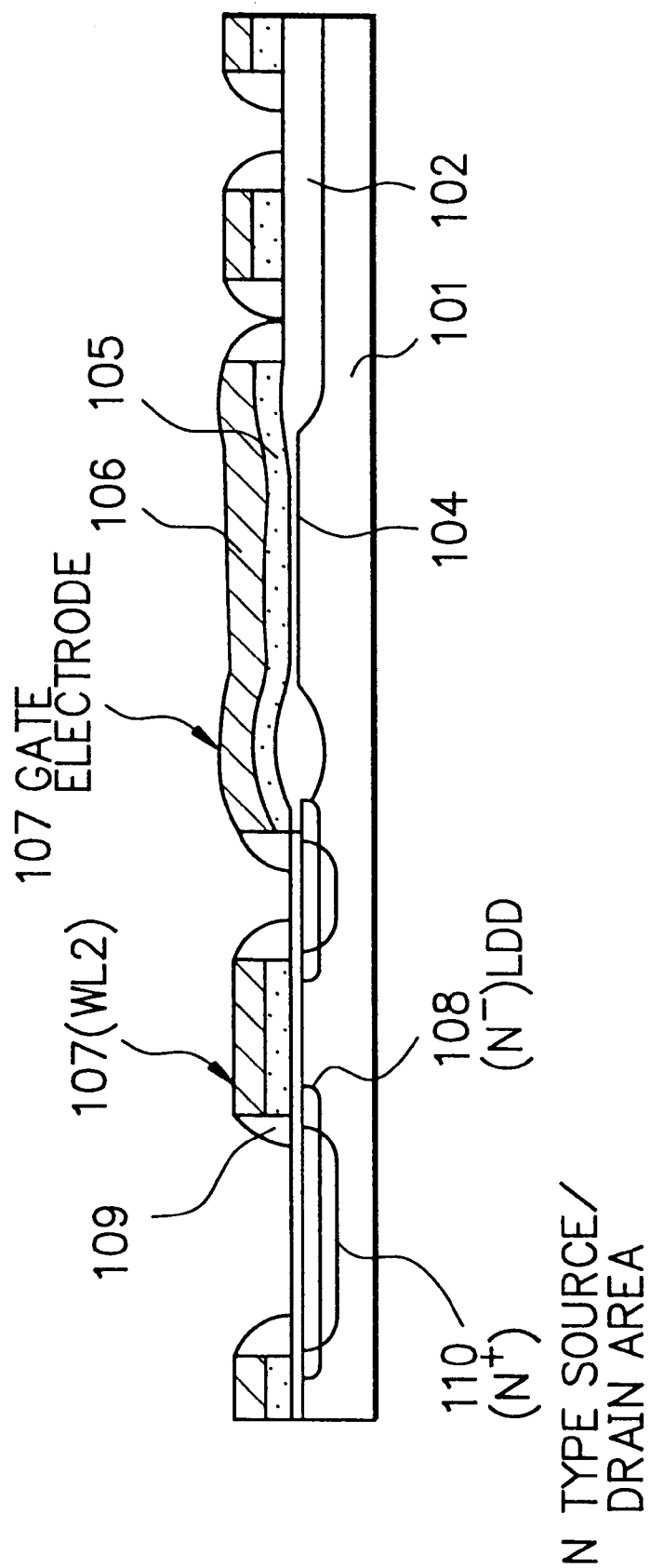
FIG. 6 is a sectional view showing the second process.

FIG. 5 is a layout diagram showing a second process to manufacture a SRAM of the present invention. FIG. 6 is a sectional view showing the second process. Referring to FIGS. 5 and 6, the second process is explained. First, a gate dielectric interlayer 104 made of a thin silicon oxide film is formed at the active area 103. A laminated film laminated a polysilicon film 105 and a tungsten silicide (WSi) film 106 is formed on the whole surface. After this, a selective etching is implemented to this laminated film by the photo lithography technology and each gate electrode 107 of the transferring transistors Qt1 and Qt2, and the driving transistors Qd1 and Qd2 is formed. The gate electrodes 107 of the transferring transistors Qt1 and Qt2 are composed of as word lines WL1 and WL2.

After this, a N type impurity such as arsenic is ion implanted into in lightly doped state on the whole surface, an LDD (lightly doped drain) area 108, that is, a lightly doped N type area is formed at the active area 103, using the element separating dielectric interlayer 102 and the gate electrode 107 as a mask. Moreover, after a silicon oxide film is formed on the whole surface, an anisotropic etching is implemented to this silicon oxide film and a side wall 109 is formed at the side surface of the gate electrode 107. And N type impurity is ion implanted into the active area 103 in heavily doped state utilizing the side wall 109, and a N type source/drain area 110 is formed.

Figure 7:
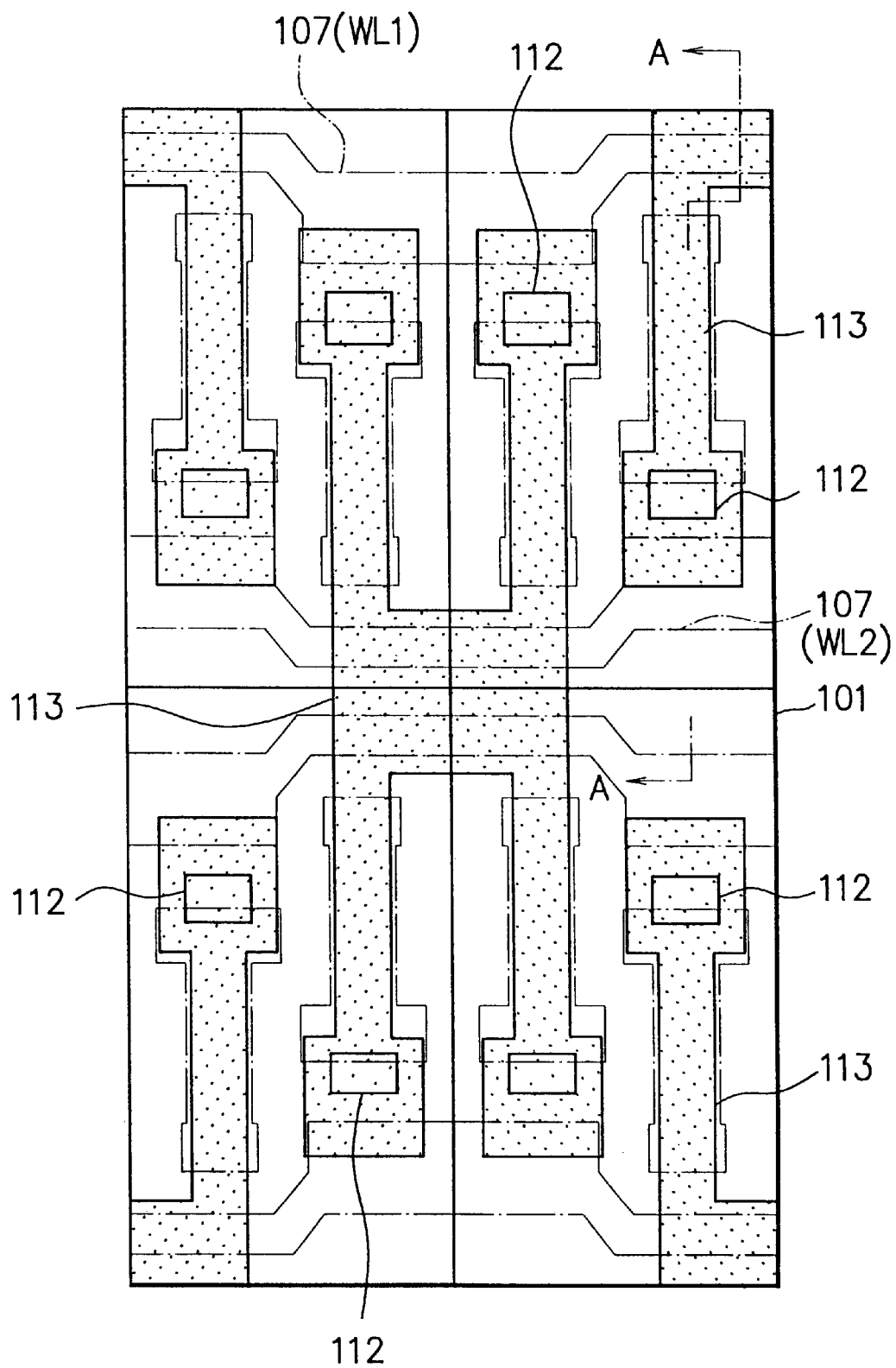
FIG. 7 is a layout diagram showing a third process to manufacture a SRAM of the present invention.
Figure 8:
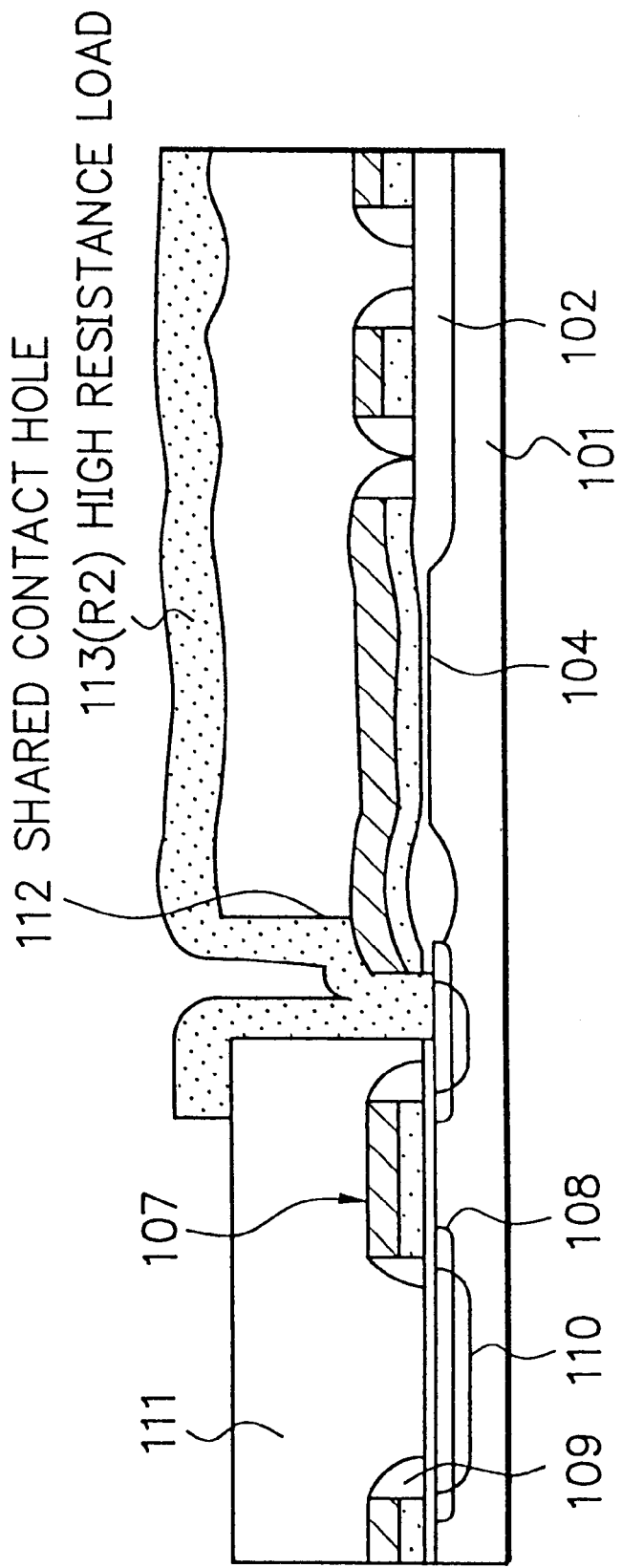
FIG. 8 is a sectional view showing the third process.

FIG. 7 is a layout diagram showing a third process to manufacture a SRAM of the present invention. FIG. 8 is a sectional view showing the third process. Referring to FIGS. 7 and 8, the third process is explained. A first dielectric interlayer 111 covering the surface of the P type silicon substrate 101 including the gate electrode 107 is formed by forming a CVD (chemical vapor deposition) silicon oxide film on the whole surface. And at the first dielectric interlayer 111, a first shared contact hole 112 is opened for the N type source/drain area 110 which is common for the drain area of the driving transistors Qd1 and Qd2 and the source area of the transferring transistors Qt1 and Qt2, as shown at the equivalent circuit in FIG. 1. At this time, the first shared contact hole 112 is opened in the state that a part of the first shared contact hole 112 makes a part of the gate electrode 107 of the driving transistors Qd1 and Qd2 expose. And a polysilicon film or a SIPOS film is formed on the whole surface and a selective etching making a required pattern is implemented to this film and high resistance loads 113 (R1 and R2) are formed. At this time, a part of the polysilicon film becoming an end of the high resistance load is formed inside the first shared contact hole 112. The first shared contact hole 112 is composed of as a shared contact hole in which the drain area of one driving transistor and the source area of one transferring transistor and the gate electrode of the other driving transistor are electrically connected together to the high resistance load 113, by this polysilicon film.

Figure 9:
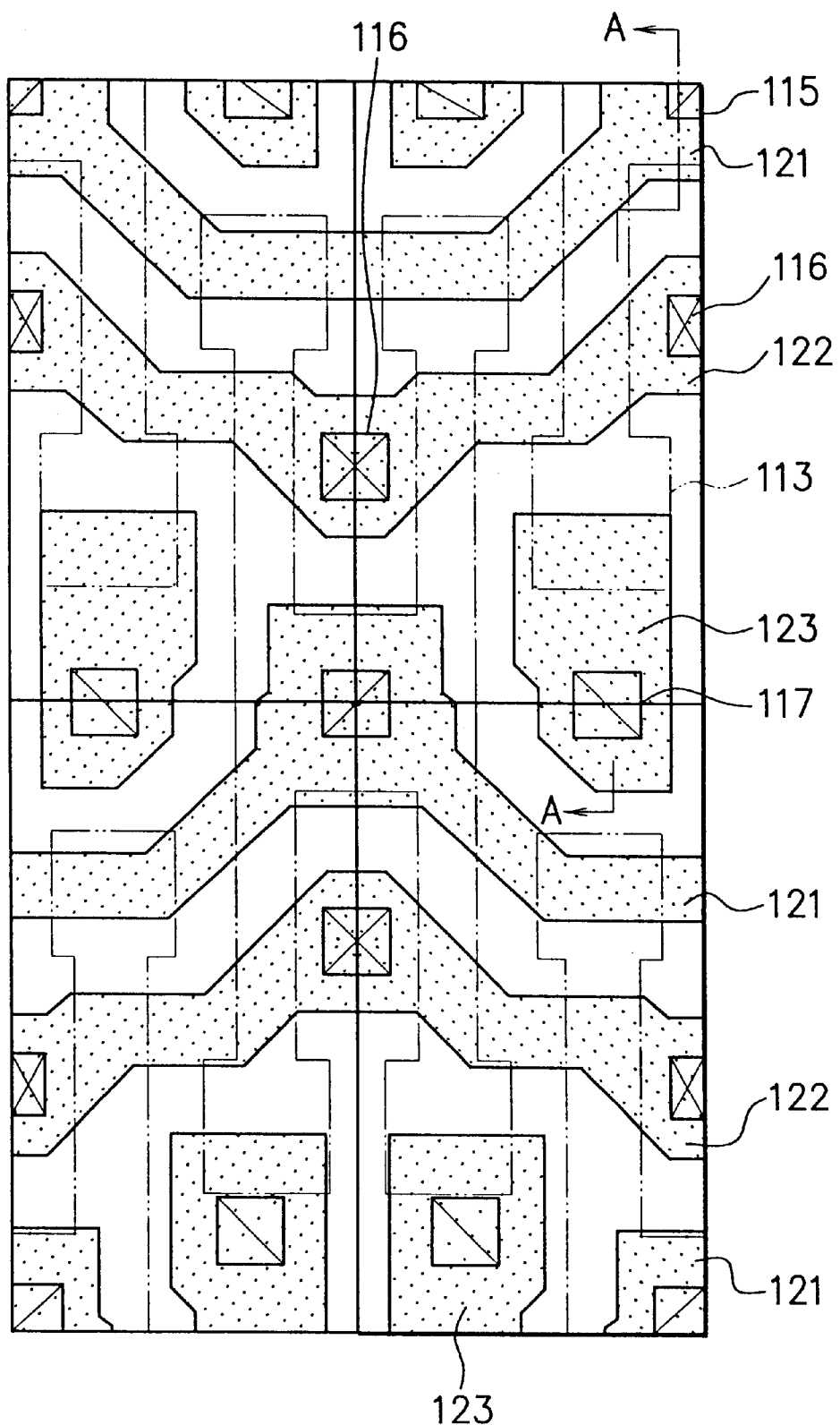
FIG. 9 is a layout diagram showing a fourth process to manufacture a SRAM of the present invention.
Figure 10:
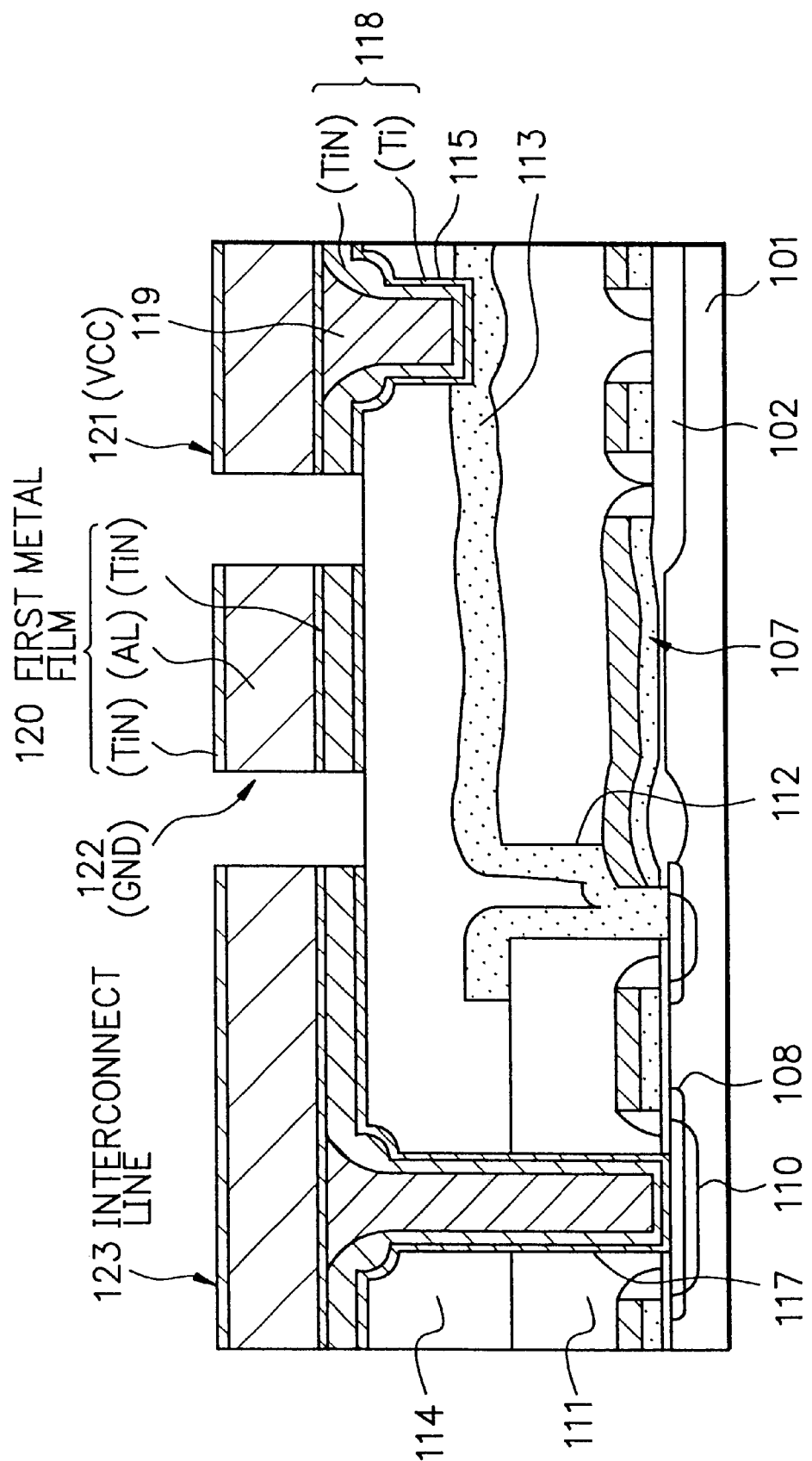
FIG. 10 is a sectional view showing the fourth process.

FIG. 9 is a layout diagram showing a fourth process to manufacture a SRAM of the present invention. FIG. 10 is a sectional view showing the fourth process. Referring to FIGS. 9 and 10, the fourth process is explained. A second dielectric interlayer 114 covering the high resistance load 113 is formed by forming the CVD silicon oxide film on the whole surface. At this time, in order to make the patterning of a first metal film at the following process easy, it is desirable that the surface is flattened by a CMP (chemical mechanical polishing) method. And at a part of the second dielectric interlayer 114, a second contact hole 115 which exposes the other part of the polysilicon film becoming the other end of the high resistance load 113 is opened.

A third contact hole 116 for exposing the source area of the driving transistors Qd1 and Qd2 and a fourth contact hole 117 for exposing the source area of the transferring transistors Qt1 and Qt2 are opened through the first dielectric interlayer 111 and the second dielectric interlayer 114. The second contact hole 115, the third contact hole 116 and the fourth contact hole 117 can be opened at the same time. After opening the second contact hole 115 by etching the second dielectric interlayer 114, the etching is successively implemented to the first dielectric interlayer 111, and the third contact hole 116 and the fourth contact hole 117 are opened. At this time, at the second contact hole 115, the progress of etching is stopped by the polysilicon film (the high resistance load 113).

A Ti (titanium) film and a TiN (titanium nitride) film are formed as a barrier film 118 on the whole surface of the second dielectric interlayer 114. After this, concave parts formed at the second contact hole 115, the third contact hole 116 and the fourth contact hole 117 are filled with tungsten 119. As this filling, the tungsten film is formed to the sufficient thickness to fill in each through hole and its surface is flattened by the CMP method, this method is usable. On the flattened whole surface, as a first metal film 120, a TiN (titanium nitride) film, an Al (aluminum) film and a TiN (titanium nitride) film are laminated. And the etching is implemented to this first metal film 120 in order to have a required pattern, and from the part of this, a VCC line (a first power supply layer) 121, a GND line (a second power supply layer) 122 and an interconnect line 123 are formed.

At this time, the VCC line 121 is electrically connected to the other end of the high resistance load 113 through the second contact hole 115 composed of as the VCC contact. The GND line 122 is electrically connected to the source areas of the driving transistors Qd1 and Qd2 through the third contact hole 116 composed of as the GND contact. The interconnect line 123 is electrically connected to the source areas of the transferring transistors Qt1 and Qt2 through the fourth contact hole 117 composed of as the relaying contact.

Figure 11:
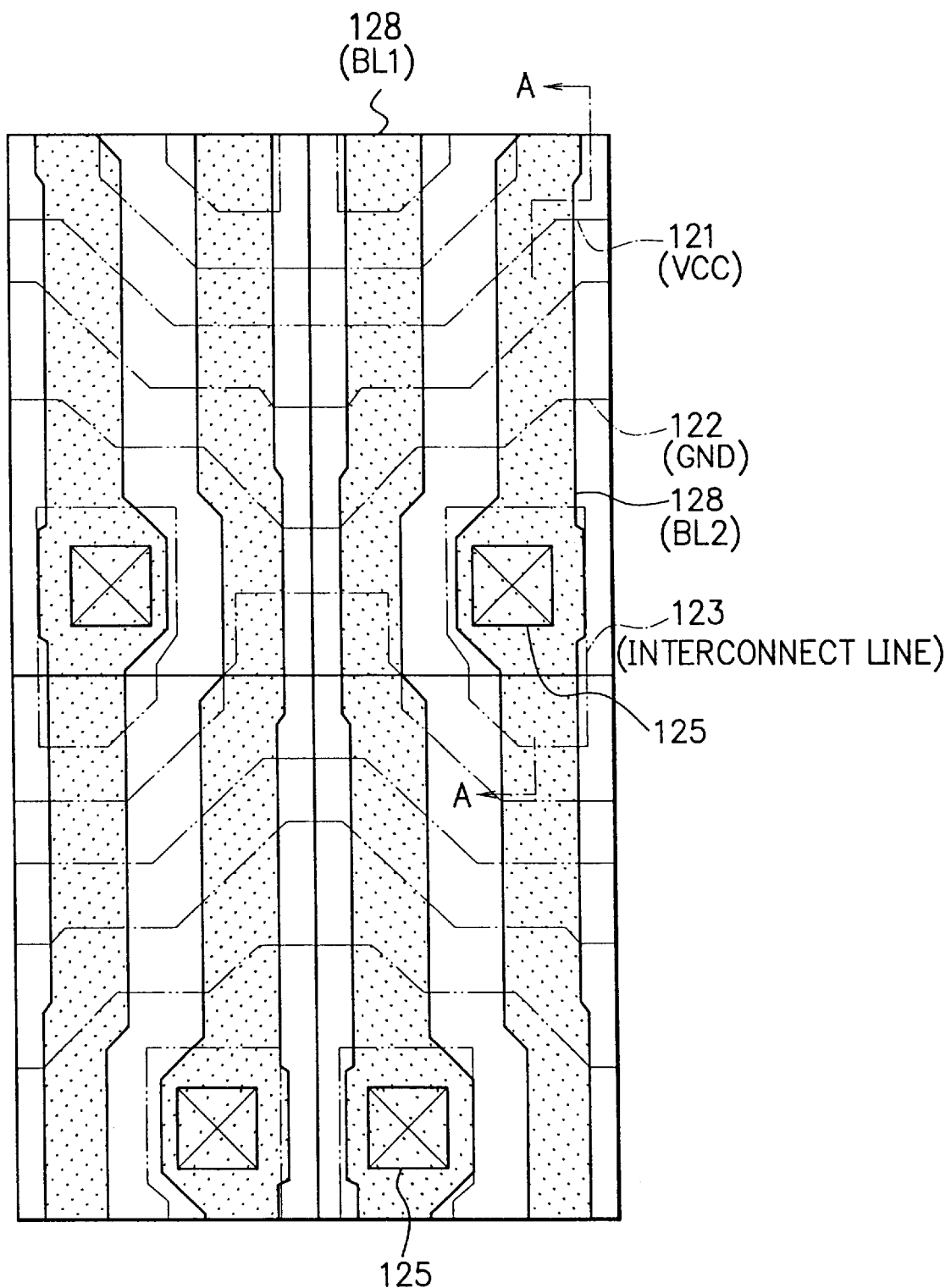
FIG. 11 is a layout diagram showing a fifth process to manufacture a SRAM of the present invention.

FIG. 11 is a layout diagram showing a fifth process to manufacture a SRAM of the present invention. FIG. 12 is a sectional view showing the fifth process. Referring to FIGS. 11 and 12, the fifth process is explained. The CVD silicon oxide film is formed on the whole surface and a third dielectric interlayer 124 covering the first metal film 120 (the VCC line 121, the GND line 122 and the interconnect line 123) is formed. At the third dielectric interlayer 124, a fifth contact hole (bit line contact hole) 125 to expose a part of the interconnect line 123 is opened. And a Ti film and a TiN film are formed as a barrier film 126 on the whole surface, and after this, tungsten 127 is filled at the concave part of the fifth contact hole (bit line contact hole) 125. For this filling, the same method used for the first metal film 120 is applicable. On this, as a second metal film 128, a TiN film, an Al film and a TiN film are laminated. And the etching is implemented to this second metal film 128 in order to have a required pattern and bit lines BL1 and BL2 are formed. These bit lines BL1 and BL2 are electrically connected to the interconnect line 123 through the fifth contact hole 125 and are further electrically connected to the drain areas of the transferring transistors Qt1 and Qt2 through this interconnect line 123, that is, the fourth contact hole 117. And the fifth contact hole (bit line contact hole) 125 and the fourth contact hole 117 are composed of as bit line contact. After this, a passivate dielectric interlayer 129 covering bit lines BL1 and BL2 made of the second metal film 128 is formed and a SRAM memory cell is completed.

At the SRAM formed by the above mentioned processes, the polysilicon film of the high resistance load 113 is formed at the right above layer of the gate electrodes 107 of the driving transistors Qd1 and Qd2, and the transferring transistors Qt1 and Qt2 formed on the P type silicon substrate 101. Therefore, the first shared contact hole 112, to which the N type source/drain area 110 becoming the drain area of driving transistor and the source area of the transferring transistor, the gate electrode 107 and the high resistance load 113 are connected together, only opens a contact hole at the first dielectric interlayer 111. With this, the depth of the first shared contact hole 112 can be made shallow, even at the case that the area of the first shared contact hole 112 is made to be fine, the aspect ratio does not large. And the first shared contact hole 112 can be formed by suitably filling the polysilicon of which the high resistance load 113 is made in the contact hole and the contact resistance can be reduced. Moreover, the first shared contact hole 112 does not penetrate the other layers and it does not need to consider the interference between the first shared contact hole 112 and the other layers. Therefore, the layout margin MG1 like as shown in FIG. 2 is not necessary to prevent the short between the shared contact hole and the GND line.

Moreover, the fifth contact hole (bit line contact) 125, by which the second metal film (bit line) 128 (BL1 and BL2) is connected to the drain area (N type source/drain area 110) of the transferring transistors Qt1 and Qt2 formed on the semiconductor substrate, is formed through the interconnect line 123 made of the first metal film 120 which is the same layer of the VCC line 121 and the GND line 122. Therefore, the fifth contact hole (bit line contact) 125 does not penetrate the VCC line 121 and the GND line 122 and the layout margin MG2 between the bit line contact and the VCC line shown in FIG. 2 is not necessary. With this, further reduction of the area of the memory cell becomes possible.

Figure 2:
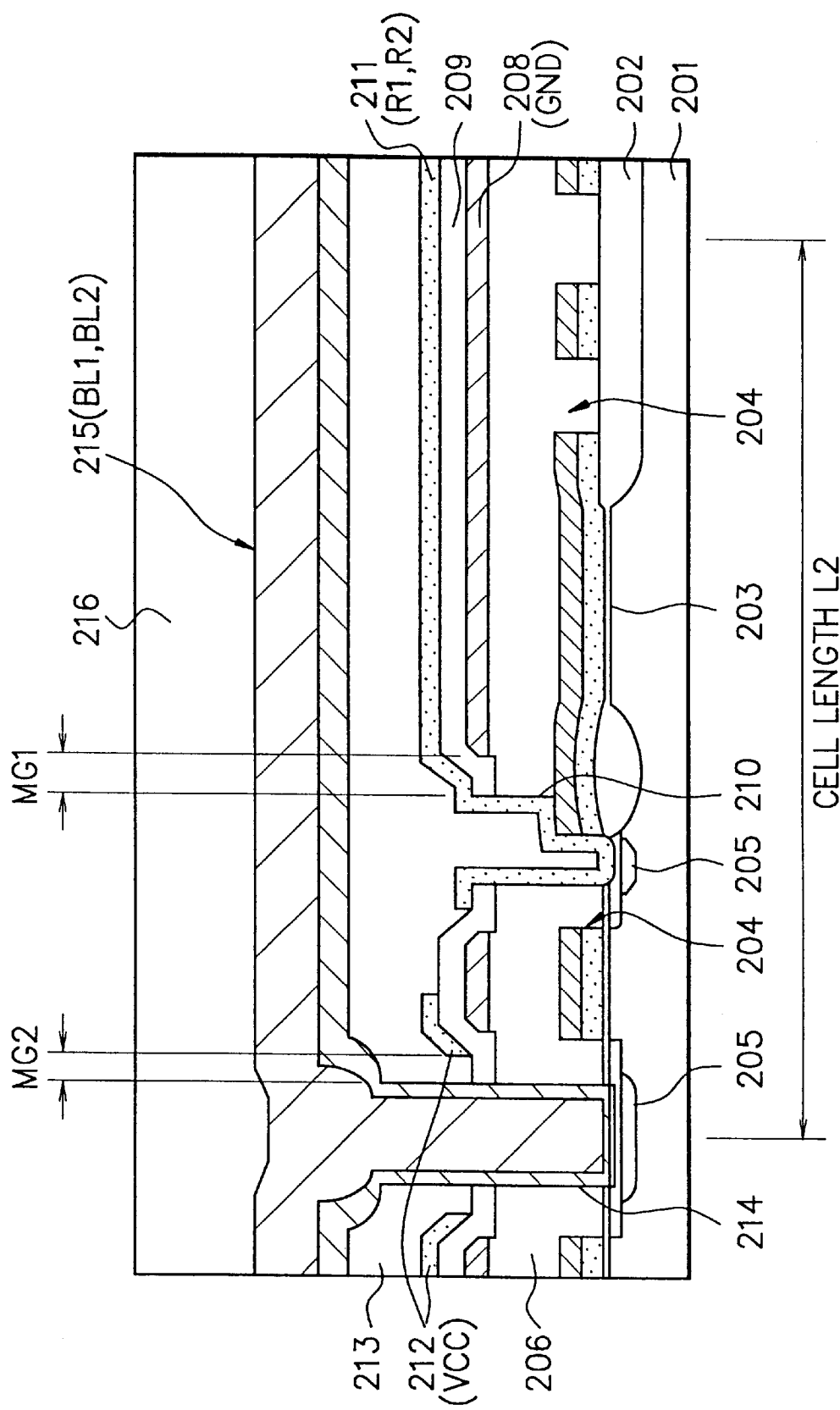
FIG. 2 is a sectional view showing an example of the conventional SRAM.
Figures 3A, 3B, 3C, 3D:
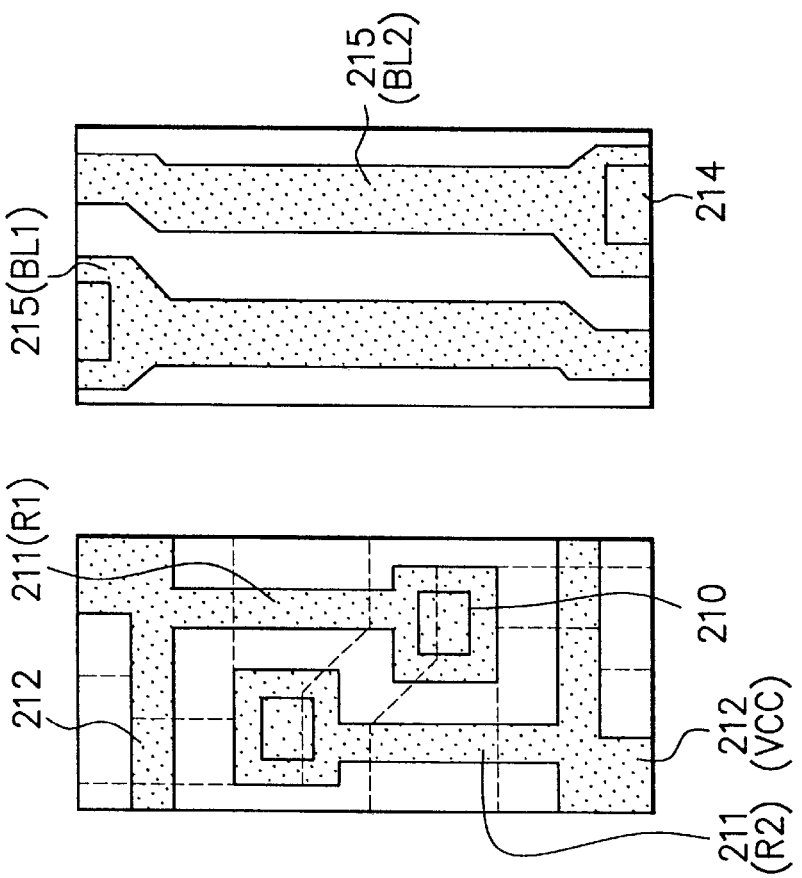
FIG. 3A is a plane view showing a layer of a cell of the conventional SRAM.
FIG. 3B is a plane view showing a layer of a cell of the conventional SRAM.
FIG. 3C is a plane view showing a layer of a cell of the conventional SRAM.
FIG. 3D is a plane view showing a layer of a cell of the conventional SRAM.

As mentioned above, at the memory cell of the embodiment of the present invention, compared with the conventional memory cell shown in FIG. 2, the margin to fit the positions at the first shared contact hole 112 and the fifth contact hole (bit line contact) 125 is not necessary. Therefore, the cell length L1, which is the length of the extending direction of the bit line at the memory cell and is the length of the direction disposed the VCC line and the GND line in parallel, is reduced and the memory cell can be reduced.

At the actual embodiment of the present invention, the size of the memory cell 2.04×3.76 $\mu m^2$ is realized. To compare with the size of the memory cell 2.08×4.32 $\mu m^2$ of the conventional structure shown in FIG. 2, about 15% of the area of the memory cell can be reduced. At the SRAM of the present invention, the respective layout patterns of the transistor active area 103, the gate electrode (word line) 107 and the second metal film (bit line) 128 are not necessary to be changed largely from the pattern of the conventional SRAM shown in FIGS. 3A, 3B, 3C and 3D. The pattern designing of the mask for memory cells needs not be redesigned from the first, it is possible to make the mask easily.

Moreover, at the embodiment of the present invention, after forming the polysilicon film becoming the high resistance load 113 which needs high temperature treatment, the first metal film 120 and the second metal film (bit line) 128 are formed. Therefore, these first and second metal films can be made of aluminum and in particular the VCC line 121 and the GND line 122 formed by the first metal film 120 are easily to be made as low resistance, the circuit area of each line can be reduced. With this, the facing area to the second metal film (bit line) 128 positioned at above can be reduced and the wiring capacity at the second metal film (bit line) 128 is reduced, consequently, the high speed at the writing and reading of information for memory cells is possible to be realized. At the same time, like as the conventional structure as shown in FIG. 2, the VCC line is formed by making the polysilicon film low resistance, therefore the impurity is not needed to be implanted to a part of the polysilicon, the mask making process and impurity implanting process for this becomes unnecessary and the simplification of the manufacturing process can be realized.

The structure of the gate electrode, the first and second metal film mentioned in the embodiment is not limited to this structure. For example, it is possible that the gate electrode is formed by one layer of polysilicon. The material for the barrier of the first and second metal film or aluminum used mainly are replaceable by the other metal.

As mentioned above, in the present invention, the high resistance load is formed at the second layer which is positioned right above the first layer formed the electrodes of the driving transistors and the transferring transistors and word lines. Therefore, the shared contact hole connecting each transistor to the high resistance load does not need to penetrate the layers of the first and second power supply lines and the layout margin between the shared contact hole and each power supply line does not need. Consequently, the area of the memory cell can be reduced.

Moreover, the interconnect line is composed of a part of the third layer constituting the first and second power supply lines and the bit line is electrically connected to the drain area of each transistor via this interconnect line. Therefore, the layout margin between the bit line contact hole and the power supply lines does not need and the area of the memory cell can be further reduced.

Furthermore, the first and second power supply lines are formed at the third layer positioning above the high resistance load formed at the second layer, therefore the first and second power supply lines can be formed by aluminum whose melting point is low. Consequently, the power supply line can be made to low resistance and the area of the power supply line can be reduced. And the facing area to the bit line is reduced and the capacity of the bit line is reduced and then the high speed processing of memorizing information can be realized.

While the present invention has been described with reference to the particular illustrative embodiment, it is not to be restricted by this embodiment but only by the appended claims. It is to be appreciated that those skilled in the art can change or modify the embodiment without departing from the scope and spirit of the present invention.

What is claimed is:

1. A manufacturing method of semiconductor memory, comprising:

making active areas of driving transistors and transferring transistors, isolated by insulation film on a semiconductor substrate by etching;

forming word lines and gate electrodes of said driving transistors and gate electrodes of said transferring transistors with a conductive film on a gate oxide film in said transistor active areas;

forming a first dielectric interlayer;

opening a first contact hole exposing a common source/drain area for said driving transistors and said transferring transistors and exposing the gate electrode of the other driving transistor being a pair of said driving transistors on said first dielectric interlayer;

forming a high resistance load, which is electrically connected to said common source/drain area and said gate electrode via said first contact hole, by formed polysilicon into a required pattern;

forming a second dielectric interlayer;

opening a second contact hole exposing said high resistance load at said second dielectric interlayer and opening third and fourth contact holes exposing the source area of said driving transistors and the drain area of said transferring transistors at said second dielectric interlayer and said first dielectric interlayer;

forming a first power supply line connecting electrically to said high resistance load, a second power supply line connecting electrically to the source area of said driving transistor, and an interconnect line connecting electrically to the drain area of said transferring transistor, by forming said first metal film into a required pattern;

forming a third dielectric interlayer;

opening a fifth contact hole exposing said interconnect line at said third dielectric interlayer; and forming bit lines connecting electrically to said interconnect line by forming said second metal film into a required pattern.

2. A manufacturing method of semiconductor memory in accordance with claim 1, wherein:

said conductive film comprises a polysilicon film or a polycide film.

\* \* \* \* \*